(12) United States Patent
Min et al.

(10) Patent No.: US 7,753,109 B2
(45) Date of Patent: Jul. 13, 2010

(54) HEAT DISSIPATION DEVICE WITH HEAT PIPES

(75) Inventors: Xu-Xin Min, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 512 days.

(21) Appl. No.: 11/752,905

(22) Filed: May 23, 2007

(65) Prior Publication Data

US 2008/0289798 A1  Nov. 27, 2008

(51) Int. Cl.
*H05K 7/20* (2006.01)

(52) U.S. Cl. ................................. 165/104.33; 361/700

(58) Field of Classification Search ............ 165/104.33; 361/700
See application file for complete search history.

(56) References Cited

U.S. PATENT DOCUMENTS

| | | | |
|---|---|---|---|
| 6,717,813 B1 | 4/2004 | Garner | |
| 7,025,125 B2 * | 4/2006 | Sheng et al. | 165/104.33 |
| 7,343,962 B2 * | 3/2008 | Xia et al. | 165/104.33 |
| 7,520,316 B2 * | 4/2009 | Xia et al. | 165/104.33 |
| 2004/0170000 A1 * | 9/2004 | Fujiwara et al. | 361/719 |
| 2006/0144561 A1 * | 7/2006 | Lin et al. | 165/104.33 |
| 2007/0147001 A1 | 6/2007 | Lin et al. | |
| 2007/0215321 A1 * | 9/2007 | Yang et al. | 165/104.33 |
| 2009/0008065 A1 * | 1/2009 | Jin et al. | 165/104.33 |

FOREIGN PATENT DOCUMENTS

| | | |
|---|---|---|
| TW | 586650 | 5/2004 |
| TW | M267819 | 6/2005 |
| TW | M291035 | 5/2006 |

* cited by examiner

*Primary Examiner*—Leonard R Leo
(74) *Attorney, Agent, or Firm*—Jeffrey T. Knapp

(57) ABSTRACT

A heat dissipation device adapted for dissipating heat from a heat-generating device includes a heat pipe assembly and a fin set. The heat pipe assembly is adapted for absorbing heat from the heat-generating device, and includes a plurality of bending heat pipes each having a top face and a bottom face. The fin set thermally engaged with the heat pipe assembly includes a plurality of fins and has a bottom surface cooperatively formed by bottom edges of the fins. The heat pipes of the heat pipe assembly are juxtaposed with each other; the top faces of the heat pipes are thermally attached to the bottom surface of the fin set; the bottom faces of the heat pipes are positioned level with each other to form a contacting surface for contacting with the heat generating device.

4 Claims, 8 Drawing Sheets

HEAT DISSIPATION DEVICE WITH HEAT PIPES

BACKGROUND OF THE INVENTION

1. Field of the Invention

The present invention generally relates to heat dissipation devices, and more particularly to a heat dissipation device having heat pipes for cooling an electronic component, such as an integrated circuit package.

2. Description of Related Art

Electronic components, such as central processing units (CPUs) comprise numerous circuits operating at high speed and generating a mass of heat that can be deleterious to their operation. Under most circumstances, it is necessary to cool the CPUs in order to maintain safe operating conditions and assure that the CPUs function properly and reliably. In the past, various approaches have been used to cool electronic components. Typically, a finned metal heat sink can be attached to an outer surface of the CPU to remove heat therefrom. The heat absorbed by the heat sink is then dissipated to ambient air. The related finned metal heat sink is made of highly heat-conductive metal, such as copper or aluminum, and generally comprises a solid metal base for contacting with the CPU to absorb the heat therefrom and a plurality of fins formed on the base for dissipating the heat. However, as the operating speed of electronic components has increased markedly in recent years, heat sinks that dissipate the heat only by metal conduction are insufficient and as a result, heat accumulated in a bottom of the metal heat sink cannot be transferred symmetrically to the whole heat dissipation device quickly enough.

Heat pipes, which operate by phase change of working liquid sealed in a hollow pipe, have been widely used due to their excellent heat transfer properties. Typically, a heat dissipation device equipped with heat pipes has a base plate, a plurality of fins arranged vertically on the base plate and a plurality of heat pipes sandwiched between the fins and the base plate. The base plate defines a plurality of grooves complementary with shape of the heat pipes. The heat pipes used in this way help to transfer heat in the base plate to the fins symmetrically. However, the heat pipes are much better than the base plate in heat transfer capability. In addition, the existence of the base plate contributes markedly to increase cost and weight of the whole heat dissipation device.

Another technique for dissipating heat includes a base including an envelope filled with working liquid (i.e. vapor chamber). This kind of heat dissipation device includes a heat sink in contact with the base. The working fluid circulates between a liquid phase and a gaseous phase in the vapor chamber in a manner such that heat is taken up at a point that is in contact with the CPU, and the heat is released at a point in contact with the heat sink. This structure has the advantage of better heat dissipation, but is complex and expensive.

Accordingly, what is needed is a heat dissipation device with heat pipes which has an enhanced heat dissipation performance and is inexpensive.

SUMMARY OF THE INVENTION

A heat dissipation device adapted for dissipating heat from a heat-generating device, includes a heat pipe assembly and a fin set. The heat pipe assembly is adapted for absorbing heat from the heat-generating device, and includes a plurality of bending heat pipes each having a top face and a bottom face. The fin set thermally engaged with the heat pipe assembly, includes a plurality of fins and a bottom surface. The heat pipes of the heat pipe assembly are juxtaposed with each other. The top faces of the heat pipes are thermally attached to the bottom surface of the fin set. The bottom faces of the heat pipes level with each other to form a contacting surface for contacting with the heat generating device.

Other advantages and novel features will become more apparent from the following detailed description of preferred embodiment when taken in conjunction with the accompanying drawings, in which:

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
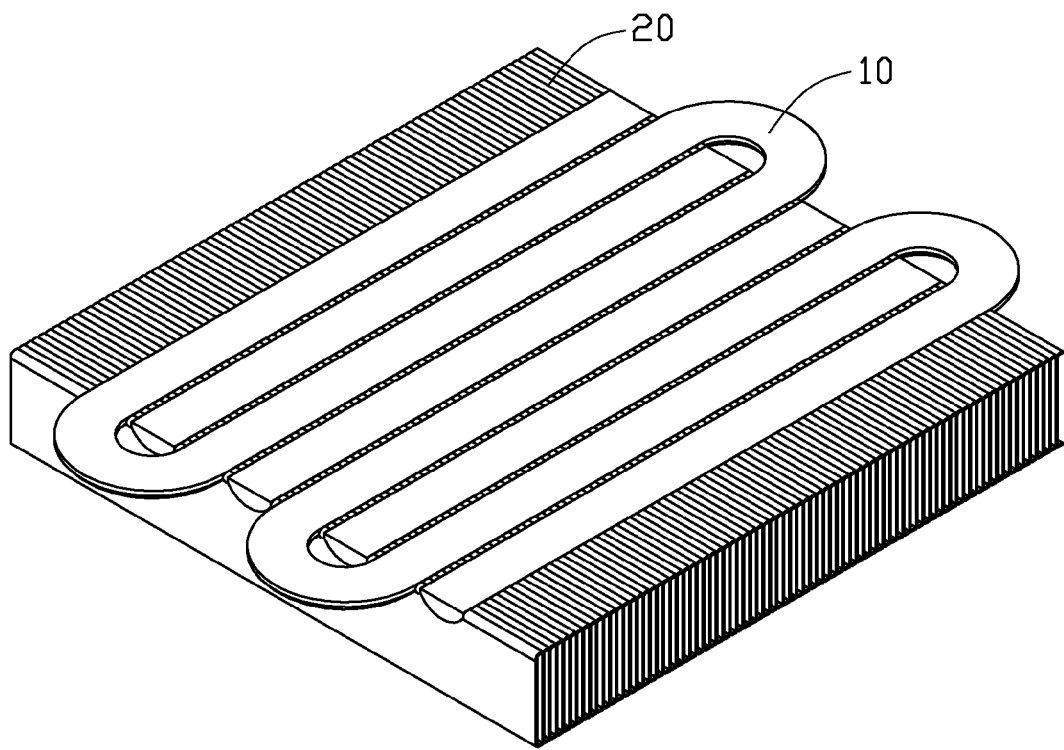
FIG. 1 is an inverted, assembled view of a heat dissipation device in accordance with a first embodiment of the present invention.
Figure 2:
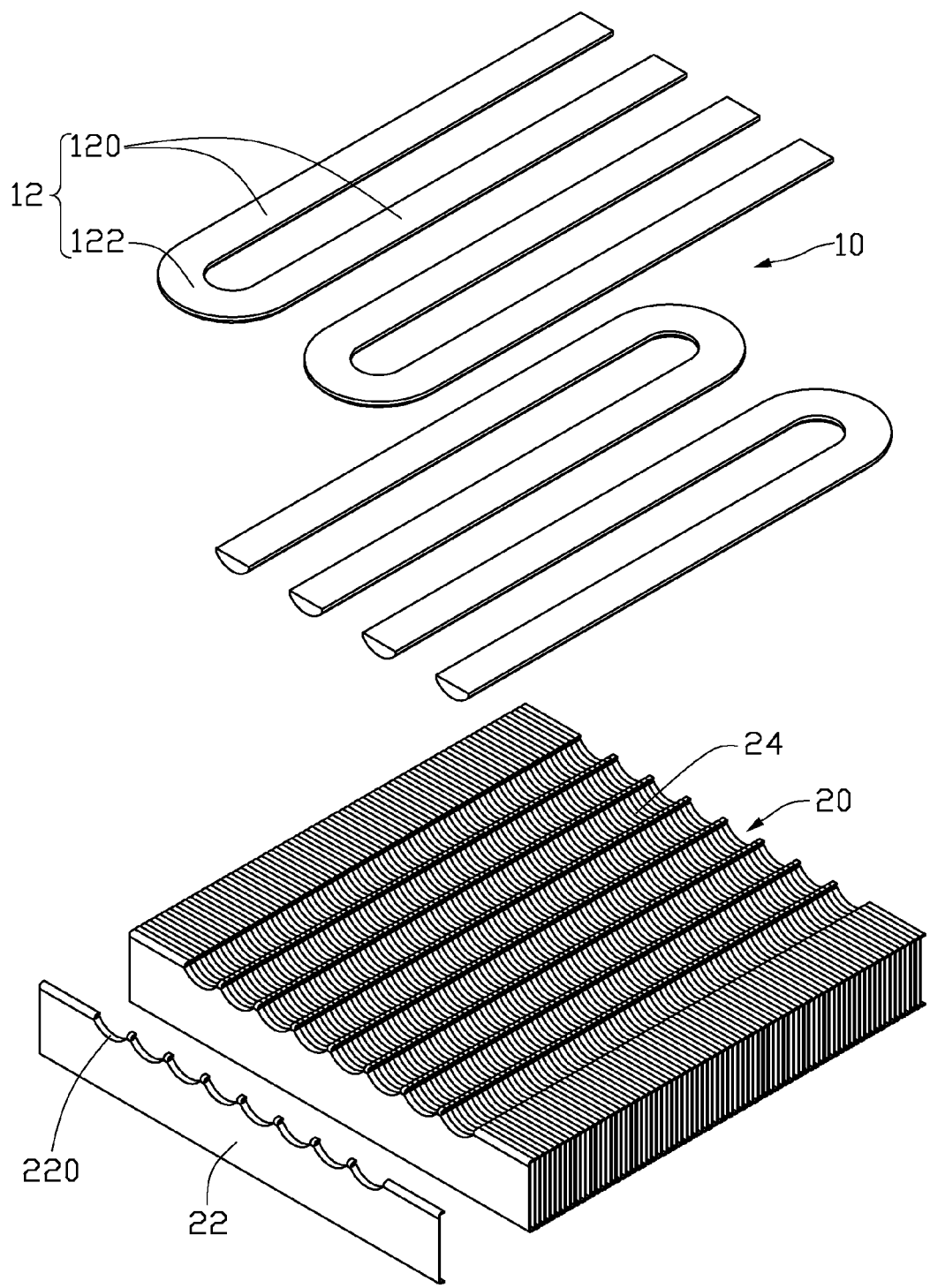
FIG. 2 is an exploded view of FIG. 1.

Referring to FIG. 1 and FIG. 2, a heat dissipation device in accordance with a first embodiment of the present invention is shown. The heat dissipation device can be mounted to a printed circuit board (not shown) to remove heat from a heat-generating electronic device, such as a CPU (not shown) mounted on the printed circuit board. The heat dissipation device comprises a heat pipe assembly 10 contacting with the CPU and a fin set 20 located on the heat pipe assembly 10.

Heat pipes of the heat pipe assembly 10 can be different in quantity in different embodiments. The heat pipe assembly 10 comprises two pairs of U-shaped heat pipes 12 in the first embodiment. The heat pipes 12 each are D-shaped in cross section, namely the heat pipes 12 each having a relatively planar bottom face facing toward the CPU, and an arc-shaped top face facing toward the fin set 20. Each heat pipe 12 comprises two elongated first sections 120 and a bent second section 122 connecting the two first sections 120 together. The two first sections 120 are parallel to and spaced from each other with a distance slightly larger than a width of the cross section of the heat pipe 12, so that one first section 120 of one heat pipe 12 can be disposed snugly between the two first sections 120 of another heat pipe 12.

The fin set 20 vertically standing on the heat pipe assembly 10 includes a plurality of spaced and parallel fins 22. Each fin 22 of the fin set 20 is formed by a rectangular thin metal sheet and defines eight sequential notches 220 in a bottom portion thereof. The notches 220 are in a shape complementary with the top face of the first sections 120 of the heat pipes 12, so as to perfectly receiving the first sections 120 of the heat pipes 12 therein. The fins 22 each have a flange (not labeled) extending perpendicularly from a bottom edge thereof. The flange is arced corresponding to the shape of the top of the notch 220 of the fin 22, for maximizing a contacting area between the fins 22 and the heat pipes 12. In the fin set 20, the flange of a rear one of the fins 22 abuts the flange of a front one of the fins 22. The flanges of the fins 22 cooperatively define a surface at the bottom of the fin set 20. The notches 220 in successive fins 22 form eight corresponding parallel receiving grooves 24 for receiving the heat pipes 12, with the flanges thermally engaging with the heat pipes 12.

In assembly of the heat dissipation device as shown in FIG. 1, the heat pipes 12 are thermally attached to the bottom surface of the fin set 20, with the first sections 120 of the heat pipes 12 acting as a base to absorb heat from the CPU. The first sections 120 of the heat pipes 12 are all engagingly received in the corresponding grooves 24 of the fin set 20, while the bent second sections 122 of the heat pipes 12 are positioned in alternating fashion on two opposite lateral sides of the fin set 20. The four heat pipes 12 are divided into two pairs that are juxtaposed to each other with the first sections 120 thereof abutting against each other. The two heat pipes 12 of each pair are oriented opposite to each other. One first section 120 of one heat pipe 12 is disposed between two first sections 120 of another heat pipe 12 in a same pair. The two second sections 122 of the heat pipes 12 project outwardly beyond the two opposite lateral sides of the fin set 20, respectively. The arc top surfaces of the heat pipes 12 thermally engage with the flanges of the fins 22 in the grooves 24 of the fin set 20. The flat bottom surfaces of the heat pipes 12 level with each other essentially and form a contacting surface contacting the CPU.

In use, the contacting face of the heat pipes 12 of the heat dissipation device thermally contacts the CPU, the first sections 120 of the heat pipes 12 absorb heat from the CPU and directly transfer the heat to the fins 22 of the fin set 20 to be dissipated to ambient air.

Figure 3:
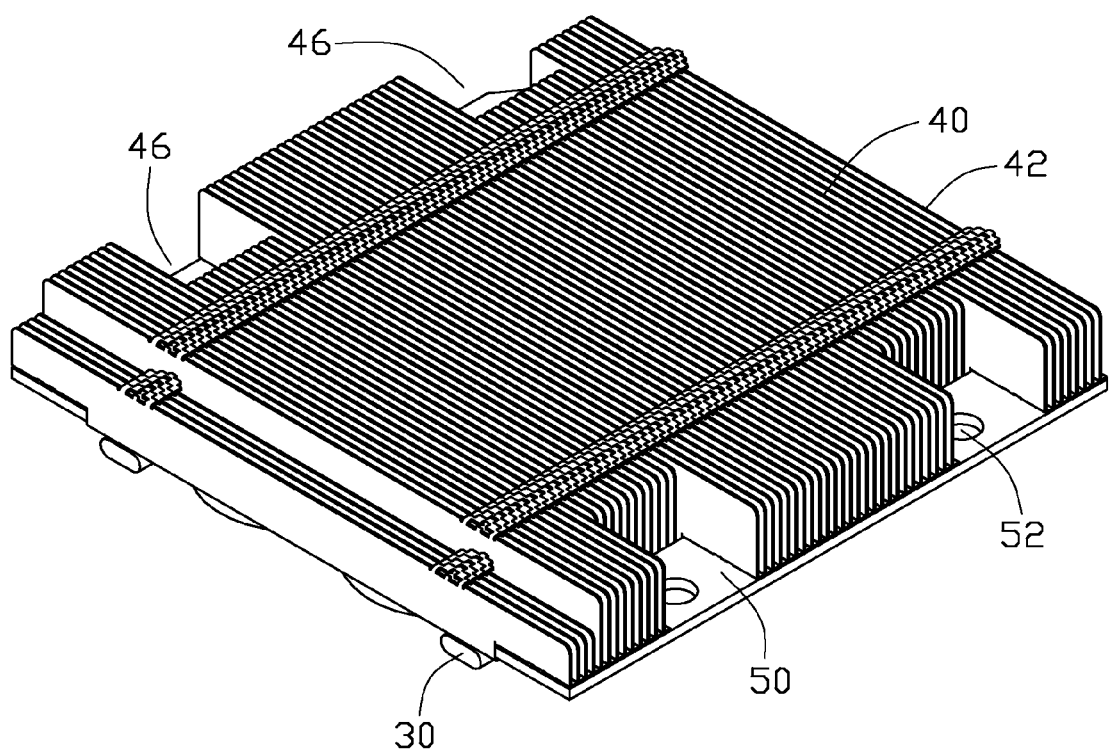
FIG. 3 is an assembled, isometric view of a heat dissipation device in accordance with a second embodiment of the present invention.
Figure 4:
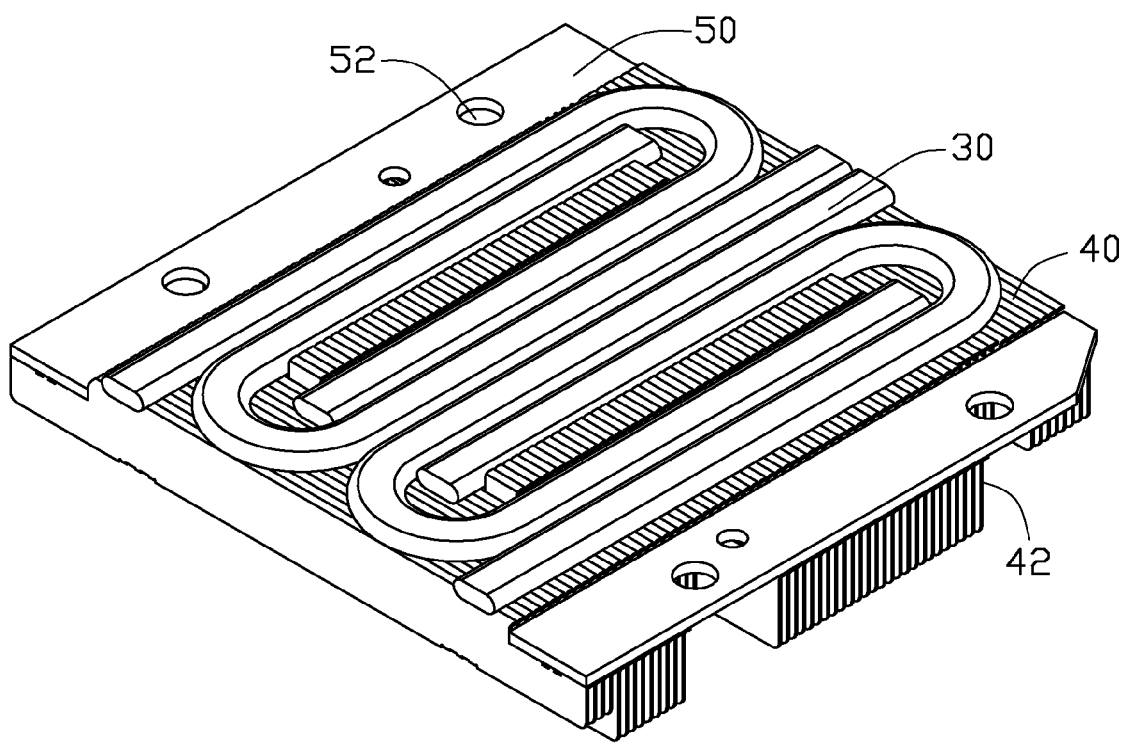
FIG. 4 is an inverted view of FIG. 3.
Figure 5:
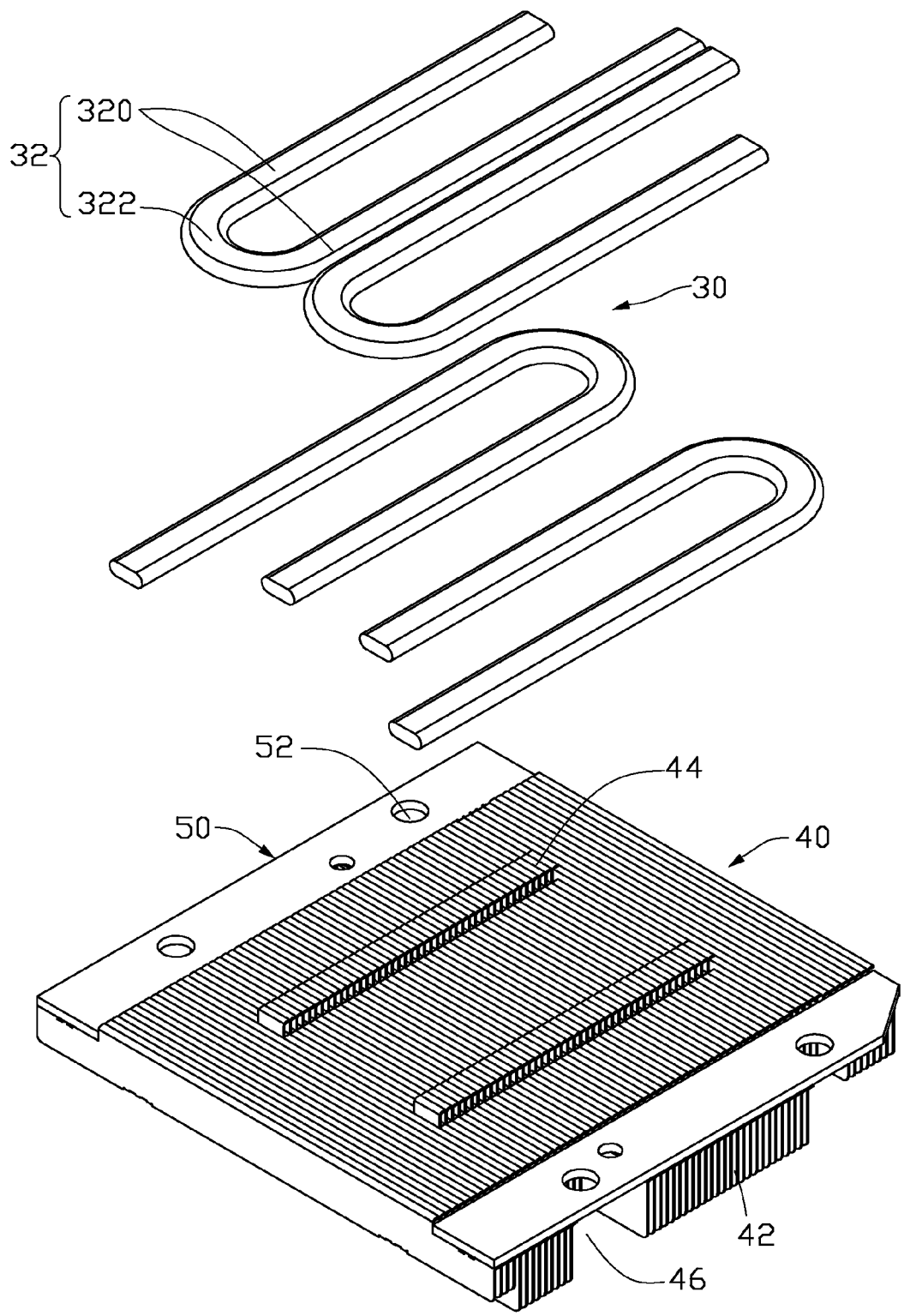
FIG. 5 is a partially exploded view of FIG. 4.

Referring to FIG. 3 to FIG. 5, a heat dissipation device in accordance with a second embodiment of the present invention is shown. In the second embodiment, the heat dissipation device comprises a heat pipe assembly 30 for contacting with the CPU, a fin set 40 and two mounting plates 50 respectively attached to two opposite lateral portions of a bottom surface of the fin set 40.

The heat pipe assembly 30 can be thermally attached to the bottom surface of the fin set 40 by soldering, and includes four identical heat pipes 32. The heat pipes 32 each are substantially U-shaped in profile and flattened oval shape in a cross section thereof; thus, each heat pipe 32 has two flattened faces respectively at a top and bottom thereof. The heat pipes 32 each comprise two elongated and spaced first sections 320 and a bent second section 322 connecting the two first sections 120 together. The two first sections 320 are parallel to each other and define a receiving space (not labeled) therebetween.

The fin set 40 comprises a plurality of individual fins 42 arranged side by side and assembled together. Each fin 42 is made of a highly thermally conductive material such as aluminum or copper. Each fin 42 has a flange (not labeled) bent from a bottom edge thereof, and the flanges of the fin 42 are formed so as to be coplanar with each other to form a flat bottom surface. The fin set 40 defines two spaced protruding strips 44 symmetrically at the bottom surface thereof. The protruding strips 44 are parallel to each other, extending perpendicularly to the fins 42 and symmetrical relative to a central axis of the fin set 40. The fin set 40 has two pairs of spaced depressions 46 recessing from two respective lateral sides thereof.

The two mounting plates 50 are securely embedded in two lateral portions of the bottom surface of the fin set 40 and essentially level with the bottom surface of the fin set 50. The two mounting plates 50 each define two through holes 52 corresponding with the depressions 46 of the fin set 40 for receiving fixtures (not shown) to mount the heat dissipation device to the CPU.

As shown in FIG. 4, in assembly of the heat dissipation device according to the second embodiment, the heat pipes 32 are fixed on the bottom surface of the fin set 40 by soldering or adhesive to act as a base for absorbing heat from the CPU. The heat pipes 32 are separated into two pairs and arranged in a way similar to that of the heat pipes 12 of the first embodiment, but a distance between the two first sections 320 of the heat pipes 32 is larger than that of the first sections 120 of the heat pipes 12. The two heat pipes 32 in each pair are oriented in directions opposite to each other and their first sections 320 abut against one another respectively. The two inner first sections 320 of two heat pipes 32 abut against two opposite lateral sides of corresponding protruding strips 44 of the fin set 40. The four first sections 320 respectively belonging to four heat pipes 32 are juxtaposed intimately with each other between the two protruding strips 44 of the fin set 40. The bottom surfaces of the heat pipes 32 and the protruding strips 44 are positioned level with each other, thereby forming a contacting surface for contacting with the CPU.

Figure 6:
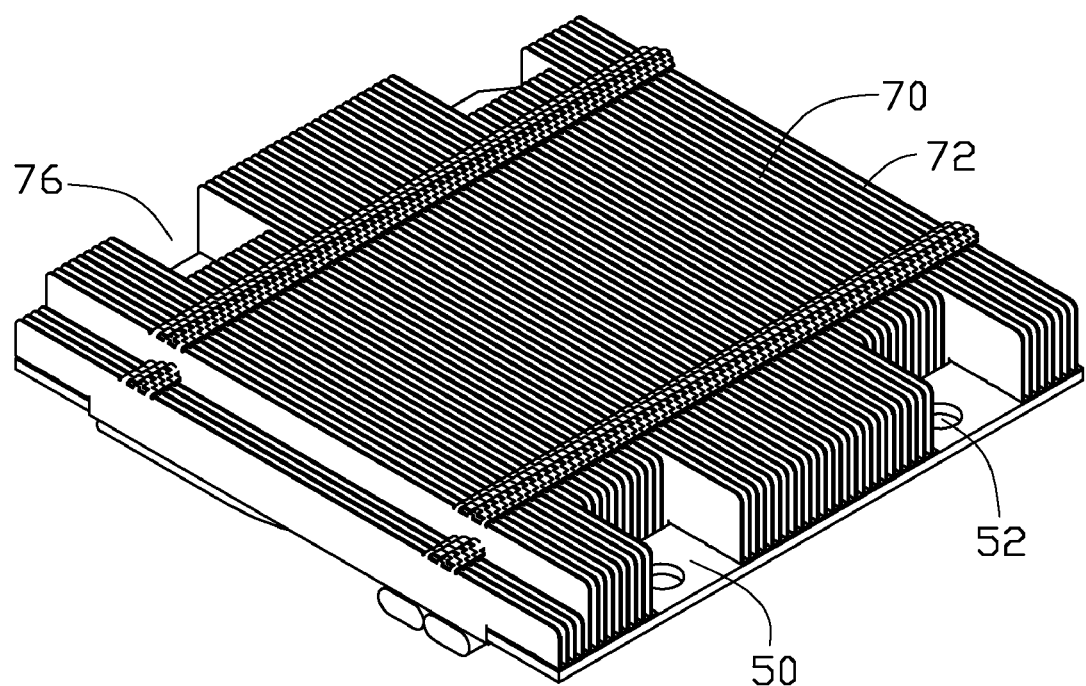
FIG. 6 is an assembled, isometric view of a heat dissipation device in accordance with a third embodiment of the present invention.
Figure 7:
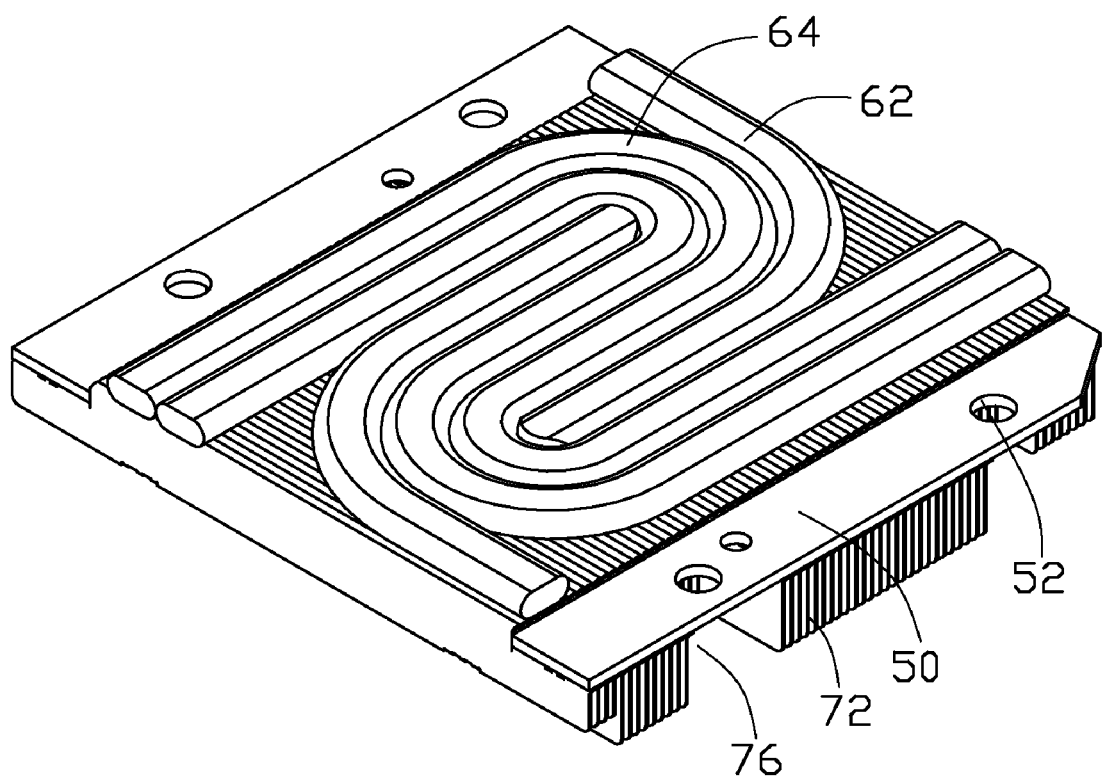
FIG. 7 is an inverted view of FIG. 6.
Figure 8:
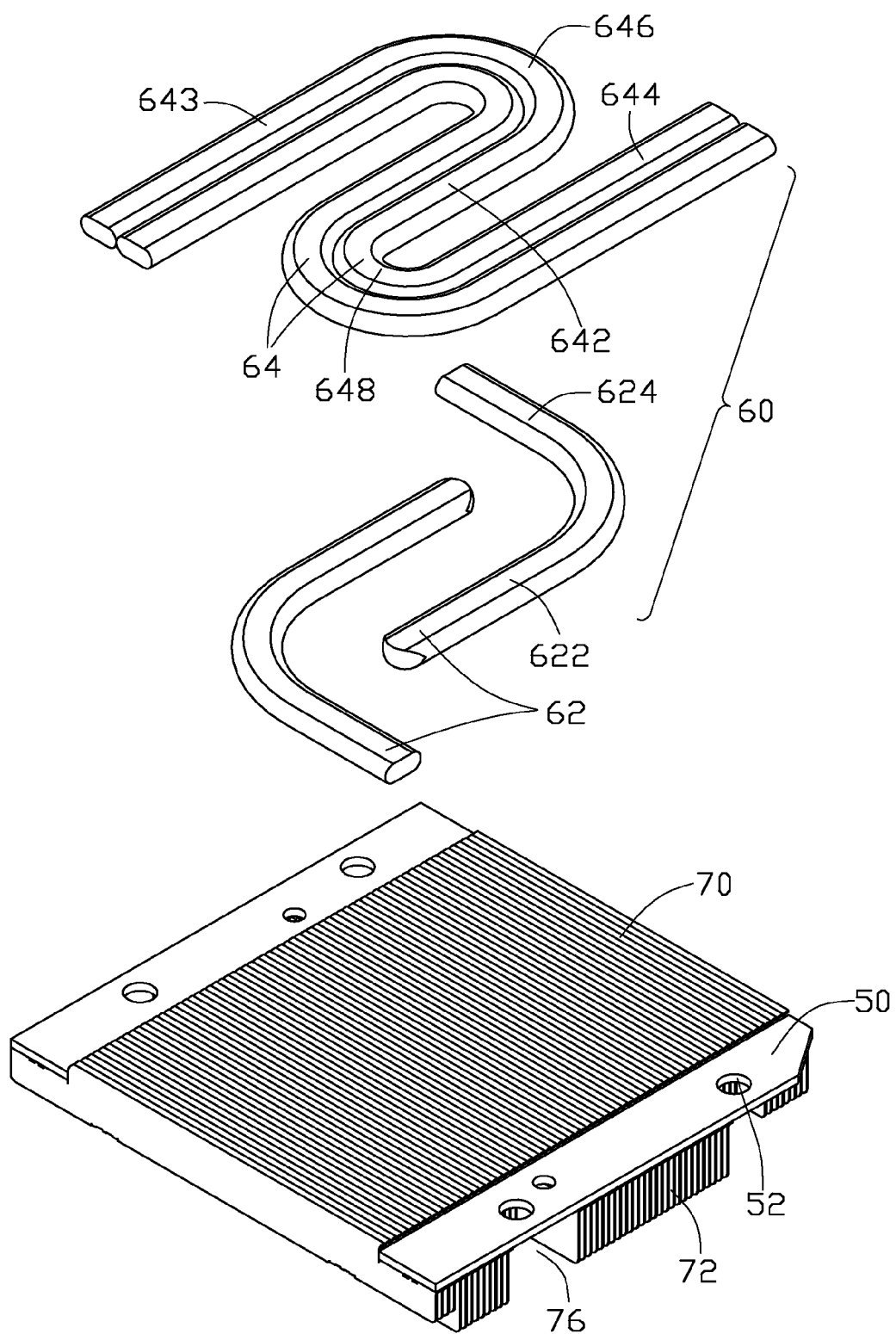
FIG. 8 is a partially exploded view of FIG. 7.

Referring to FIG. 6 to FIG. 8, a heat dissipation device in accordance with a third embodiment of the present invention is shown. In the third embodiment, the heat dissipation device comprises a heat pipe assembly 60 for contacting with the CPU, a fin set 70 and two mounting plate 50 respectively attached to two opposite portions of a bottom surface of the fin set 70.

The heat pipe assembly 60 can be thermally attached to the bottom surface of the fin set 70 by soldering, and includes two first heat pipes 62 and two second heat pipes 64. The heat pipes 62, 64 each are flattened oval shape in a cross section thereof; thus, each heat pipe 62, 64 has two flattened faces respectively at a top and bottom thereof. The first heat pipes 62 each are substantially L-shaped in profile and comprise a first conducting portion 622 and a second conducting portion 624 perpendicular to the first conducting portion 622. The second heat pipes 64 each are substantially S-shaped and comprise a first linear portion 642, a second linear portion 643, a third linear portion 644, a first arched portion 646 and a second arched portion 648. The second and third linear portions 643, 644 are located at two respective lateral sides of the first linear portions 642 and parallel to the first portion 642. The first arc portion 646 extends from an end of the first portion 642 to connect with the second linear portion 643, while the second arc portion 648 extends from another end of the first linear portion 642 to connect with the third linear portion 644. A distance from the first linear portion 642 to the second linear portion 643 is longer than that from the first linear portion 642 to the third linear portion 644.

The fin set 70 comprises a plurality of individual fins 72 arranged side by side. Each fin 72 is made of a highly thermally conductive material such as aluminum or copper. Each fin 72 has a flange (not labeled) bent from a bottom edge thereof, and the flanges of the fin 72 are coplanar with each other to form a flat bottom surface. The fin set 70 has two pairs of spaced depressions 76 defined in two respective lateral sides thereof.

The two mounting plates 50 are securely embedded in two ends of the bottom surface of the fin set 70 and essentially level with the bottom surface of the fin set 50. The two mounting plates 50 each define two through holes 52 corresponding with the depressions 76 of the fin set 40 for receiving fixtures (not shown) to mount the heat dissipation device on the CPU.

As shown in FIG. 7, in assembly of the heat dissipation device according to the third embodiment, the heat pipe assembly 60 is thermally attached to the bottom surface of the fin set 70 by soldering or adhering to act as a base. The first linear portion 642 of the second heat pipe 64 spans a center of the bottom surface of the fin set 70, the second linear portion 643 is located adjacent to one mounting plate 50 embedded in the bottom surface of the fin set 60, the third linear portion 644 is located adjacent to another mounting plate 50. The linear portions 642, 643, 644 are each parallel to the two opposite lateral sides of the fin set 70. The first arched portion 646 cooperates with the first and the second linear portions 642, 643 to define a first U-shaped region (not labeled), while the second arched portion 648 cooperates with the first and third linear portions 642, 644 to define a second U-shaped region (not labeled), which is smaller than the first U-shaped region. The first and second U-shaped regions have opposite orientations. The second U-shaped region of one of the second heat pipes 64 is located in and closely surrounded by the first U-shaped region of another one of the second heat pipes 64. The two first conducting portions 622 of the two first heat pipes 62 are respectively disposed in the second U-shaped regions and abutting against the first and third linear portions 642, 644 of the second heat pipes 64. The two second conducting portions 624 of the two first heat pipes 62 spread outwardly along the two respective first arc portions 646 of the second heat pipes 64 toward opposite directions. The bottom surfaces of the heat pipe assembly 10 are coplanar and form a contacting surface for contacting with the CPU.

According to the aforementioned description of the invention, in use of the dissipation device, a plurality of bending heat pipes are intimately juxtaposed with each other in a bottom of the fin set. Top surfaces of the heat pipes are coupled thermally to the bottom surface of the fin set. Bottom surfaces of the heat pipes are flattened and level with each other to form a contacting surface for contacting with the CPU. The heat pipes acting as a base directly absorb heat from the CPU, and then transfer the heat to the fin set to dissipate into ambient air.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for dissipating heat from a heat-generating device, comprising:
    a heat pipe assembly for absorbing heat from the heat-generating device, the heat pipe assembly comprising at least two pairs of bendable heat pipes each having a top face and a bottom face; and
    a fin set thermally engaged with the heat pipe assembly, the fin set comprising a plurality of fins and having a bottom surface;
    wherein the at least two pairs of heat pipes of the heat pipe assembly are juxtaposed with each other, the top faces of the at least two pairs of heat pipes are thermally attached to the bottom surface of the fin set, and the bottom faces of the at least two pairs of heat pipes are level with each other to form a contacting surface for contacting the heat generating device;
    wherein the at least two pairs of heat pipes are flat oval shaped in a cross section of the heat pipe assembly;
    wherein the at least two pairs of heat pipes are arranged on the bottom surface of the fin set symmetrically relative to a central axis of the fin set;
    wherein each pair of the at least two pairs of heat pipes are oriented opposite to each other, and elongated sections of the each pair of the at least two pairs of heat pipes abut against one another; and
    wherein the bottom surface of the fin set has two protruding strips extending downwardly, and the two protruding strips each are encircled by a corresponding pair of heat pipes.

2. The heat dissipation device as described in claim 1, wherein each of the heat pipes is substantially U-shaped and comprises two elongated sections parallel to each other and a bent section connecting the elongated sections together.

3. The heat dissipation device as described in claim 2, wherein one of the heat pipes has one of the elongated sections thereof located between and contacting two elongated sections of another two of the heat pipes.

4. The heat dissipation device as described in claim 1, wherein each of the protruding strips of the fin set has a height equal to that of the heat pipes and is abutted by two inner elongated sections of the corresponding pair of heat pipes.

* * * * *